United States Patent
Wortberg

(10) Patent No.: US 9,857,428 B2
(45) Date of Patent: Jan. 2, 2018

(54) MONITORING DEVICE AND MONITORING METHOD FOR A SWITCHING ELEMENT

(71) Applicant: Lisa Draexlmaier GmbH, Vilsbiburg (DE)

(72) Inventor: Michael Wortberg, Dorfen (DE)

(73) Assignee: Lisa Draexlmaier GmbH, Vilsbiburg (DE)

( * ) Notice: Subject to any disclaimer, the term of this patent is extended or adjusted under 35 U.S.C. 154(b) by 0 days.

(21) Appl. No.: 15/597,589

(22) Filed: May 17, 2017

(65) Prior Publication Data

US 2017/0336475 A1    Nov. 23, 2017

(30) Foreign Application Priority Data

May 18, 2016  (DE) ........................ 10 2016 109 137

(51) Int. Cl.
G01R 31/26  (2014.01)
G01R 31/327 (2006.01)

(52) U.S. Cl.
CPC ..... *G01R 31/3278* (2013.01); *G01R 31/2621* (2013.01)

(58) Field of Classification Search
CPC .. G01R 31/046; G01R 31/2621; H03K 17/18; H03K 17/063; H03K 17/127; H03K 17/168; H03K 17/107; H03K 17/166
See application file for complete search history.

(56) References Cited

U.S. PATENT DOCUMENTS

| 2006/0250188 | A1  | 11/2006 | Kaya |  |
| 2011/0050324 | A1* | 3/2011  | Jacobson | G01K 7/42 327/513 |
| 2014/0368240 | A1* | 12/2014 | Shelton | H03K 17/0822 327/109 |

FOREIGN PATENT DOCUMENTS

DE    10 2012 100 830 A1    8/2012

OTHER PUBLICATIONS

Office Action in German Application No. DE 10 2016 109 137.5, dated Jan. 18, 2017.
Decision to Grant in German Application No. DE 10 2016 109 137.5, dated Feb. 22, 2017.

* cited by examiner

*Primary Examiner* — Minh N Tang
(74) *Attorney, Agent, or Firm* — Finnegan, Henderson, Farabow, Garrett & Dunner LLP

(57) ABSTRACT

A monitoring device is provided for monitoring a semiconductor-based switching element having a control input, a power input, and a power output. The monitoring device includes a charge carrier source for charging the control input of the switching element with electric charge carriers, and a measuring device for detecting a charge carrier drain from the control input of the switching element. The measuring device emits a warning signal if the charge carrier drain lies above a specified threshold value. A corresponding method for monitoring a semiconductor-based switching element is also provided.

19 Claims, 4 Drawing Sheets

MONITORING DEVICE AND MONITORING METHOD FOR A SWITCHING ELEMENT

CROSS REFERENCE TO RELATED APPLICATIONS

This application is based upon and claims the benefit of prior German Patent Application No. 10 2016 109 137.5, filed on May 18, 2016, the entire contents of which are incorporated herein by reference.

TECHNICAL FIELD

The present disclosure relates to a monitoring device for a semiconductor-based switching element and a corresponding monitoring method.

BACKGROUND

While the present disclosure is described below primarily in connection with on-board electrical systems in vehicles, it is to be understood that the present disclosure may be used in any application in which electrical loads have to be switched.

Electronic semiconductor switching elements such as MOSFETs are increasingly being used as replacements for electromechanical relays in onboard electrical systems in vehicles. The advantages of semiconductor switching elements reside in a large number of switching cycles, lower power losses, shorter switching times, and noiseless switching. However, MOSFETs can break down, thereby losing their ability to switch off a current.

Current 40V MOSFETs with an on-state resistance of less than 0.7 ma (also referred to as drain-to-source on-state resistance) are constructed in accordance with so-called trench technology, which has replaced planar technology.

Contrary to planar MOSFETs, trench MOSFETs have vertical structures. They have shorter current paths and the cells are smaller. Thus, compared to planar MOSFETs, more cells can be accommodated with a higher density on the substrate. Therefore, several tens of thousands of cells can be parallel-connected on one die.

When a voltage is applied to a conventional MOSFET between a gate (i.e. a control input) and a source (i.e. a power output), a charge builds up on the gate and the NP channel in the particular cell becomes conductive. The gate is insulated from the P and N substrate. Thus, the gate functions in each case as a capacitor against the P and the N substrate.

In the event of a cell overload, the cell structure can be destroyed and the materials may intermix, resulting in a failure or breakdown. When this occurs, the barrier layer between the drain (i.e. power input) and the source (i.e. power output) is lost and the insulation of the gate terminal is destroyed. The MOSFET then becomes permanently conductive. As a result, the particular load can no longer be switched off.

U.S. Patent Application No. 2006/0250188 A1 discloses an amplifier system and test circuitry and a method for integrity testing of a power output field effect transistor (FET) of the amplifier system. Protective circuitry is described therein that makes overvoltage protection available for components of the amplifier system and switches off or isolates components during leakage measurements.

German Patent Document DE 10 2012 100 830 A1 describes a leakage current detection system. This system includes a pulse generator that feeds a pulse to a coupling capacitor; a voltage detector that detects a voltage at the coupling capacitor; and a leakage current determination unit that compares the voltage detected by the voltage detector to a threshold value and based on the result of the comparison determines a presence or absence of the electric current leakage of a direct current supply.

There are four basic failure mechanisms relating to semiconductor-based switching elements (referred to below simply as MOSFET):

1. Overvoltage causes a breakdown of the insulating layer of the gate and of the NP barrier layer. This process is analogous to a (puncture-like) overvoltage breakthrough in a capacitor.

2. Due to the excess current the powered cell is thermally overloaded and breaks down.

3. When an inductive load is switched off, the energy contained in the inductance is to be transformed in the switching element, i.e. the MOSFET, at least whenever the protective circuitry is inadequate or if there is no protective circuitry at all. The overvoltage induced by the current change results in surge releases of other charge carriers in the substrate (the so-called avalanche breakdown). In this way, the energy of the magnetic field surrounding the line becomes thermal energy in the MOSFET. The thermal energy can cause the destruction of the MOSFET cell(s).

4. The MOSFET is operated in the linear region since the gate is not adequately charged, with the gate-to-source voltage lying between 2V and 5V. The MOSFET cell now behaves in the manner of an adjustable resistor (i.e. transistor). Particularly in the case of trench MOSFETs, problems arise from the fact that the working point of the many parallel-connected cells is not identical. This means that some cells are more conductive than others. These cells transform correspondingly more energy loss, which can lead to the destruction of individual cells.

In view of the foregoing, there is a need for improved devices and methods for monitoring damage to semiconductor-based switching elements, such as MOSFETs. One of ordinary skill will understand from this disclosure that other uses for the presented embodiments are possible as well.

SUMMARY

Embodiments of the present disclosure enable reliable operation of a MOSFET.

Embodiments of the present disclosure are based on the understanding that avoiding destruction or breakdown of a MOSFET is not possible under all circumstances. Moreover, all parallel-connected MOSFET cells will not necessarily be destroyed simultaneously due to an overload. Rather, single cells may fail individually, namely those which have to process the highest power loss or that have the weakest structure. The very high energy transferred into the single cells causes excessive stress on the neighboring cells (i.e. hot spots), with the result that the fault originating from single cells spreads to fields of cells until the entire MOSFET malfunctions and fails.

Embodiments of the present disclosure enable recognizing incipient damage to the MOSFET at an early stage, before the MOSFET fails completely. Embodiments disclose recognizing the destruction of the very first cell or cells when possible, to permit a higher-level control logic such as a vehicle control device to transition into the secure state and to switch off the MOSFET.

Embodiments of the present disclosure provide a monitoring device for a semiconductor-based switching element. The monitoring device includes a control input, a power input, and a power output, such as a MOSFET. The monitoring device includes a charge carrier source designed to charge the control input of the switching element with electrical charge carriers, and a measuring device designed to detect a charge carrier drain (i.e. an electric current) from the control input of the switching element and to emit a warning signal if the charge carrier drain lies above a specified threshold value.

Embodiments of the present disclosure provide a method for monitoring a semiconductor-based switching element with a control input, a power input and a power output, including the steps of: charging the control input of the switching element with electric charge carriers with a charge carrier source, detecting a charge carrier drain from the control input of the switching element, and emitting a warning signal if the charge carrier drain lies above a specified threshold value.

According to embodiments of the present disclosure, defective cells in the MOSFET are recognized by measuring the charge carrier drain from the control input (i.e. the gate) of the MOSFET. This charge carrier drain can also be referred to as leakage current. While every MOSFET in the normal state has a certain leakage current, increased leakage current may indicate that at least some cells in the MOSFET are already damaged or have failed. The threshold value here can be specified, for instance by the manufacturer of the semiconductor-based switching element, or it can be experimentally determined. For this purpose, for example, individual semiconductor-based switching elements with different leakage currents can be examined under a microscope in order to identify the number of defective cells for each leakage current. Generally, a permissible leakage current for a MOSFET may be in the range of 15 μA-20 μA.

According to embodiments of the present disclosure, the monitoring device can monitor the state of the semiconductor-based switching element during every switch-on procedure, for example. In addition, damage or resulting stray currents can be recognized, as for example on a printed circuit board or in an input line between the monitoring device and the switching element.

In one embodiment, the charge carrier source may be configured to charge the control input cyclically up to a predetermined upper threshold value for an electrical control voltage on the control input and to interrupt the feed of charge carriers after each charging procedure until the control voltage of the control input reaches a lower threshold value. In MOSFETs the voltage difference between the control input at the gate and the power output at the source may be decisive for the interconnect. Therefore, control voltage may be understood as this voltage difference and not an absolute voltage such as to ground.

According to embodiments of the present disclosure, the upper threshold value for an electrical control voltage on the control input may lie slightly below a maximum control voltage of the semiconductor-based switching element, for instance 0.1 V to 1 V below the maximum control voltage. The maximum admissible gate voltage of MOSFETs for voltages of up to 40 V generally lies at 20 V. The gate may be protected by an 18 V Zener diode. However, since Zener diodes do not have a sharp curve but rather a soft one, the gate charge voltage may be generally set at a maximum of 14 V to 15 V.

According to embodiments of the present disclosure, the lower threshold value can lie slightly above its switch-on voltage or interconnect voltage, which ordinarily lies at approximately 8 V. Switch-on voltage or interconnect voltage is to be understood as the voltage at which the switching element is completely connected through, that is at which it is within its saturation region. In MOSFETs the voltage at the control input is also known as gate voltage and the control input itself as the gate.

According to embodiments of the present disclosure, the control voltage oscillates back and forth between two voltage values such as 8 V and 14 V. The switching element may be continuously completely connected during this oscillating procedure. The state of the switching element can therefore also be determined during regular operation.

According to embodiments of the present disclosure, the monitoring device can have a charge carrier source in the form of either a voltage source or a current source.

According to embodiments of the present disclosure, the monitoring device may be a barrier device configured to prevent movement of the charge carrier from the control input to the charge carrier source when the charge carrier source is not active, i.e. no charge carriers or no voltage or current is/are made available. In addition, the barrier device can enable movement of the charge carrier from the charge carrier source to the control input when the charge carrier source is active, i.e. charge carriers or a voltage or a current is/are made available. If the charge carrier source is switched off, as may be the case when the control voltage has reached the upper limit value, then charge carriers can flow back into the charge carrier source. Thus, it may be possible to prevent the charge carrier movement from the control input to the charge carrier source in this state to avoid distorting the measurement of the charge carrier drain.

According to embodiments of the present disclosure, because current sources usually have a very high internal resistance, the barrier device can be omitted if a current source is used as the charge carrier source and the current source has such a high internal resistance that it only slightly distorts the measurement by the measuring device. In addition, the measuring device may take that part of the measured current into account during the measurement that is invoked by the internal resistance of the current source. For instance the measuring device may deduct it from the result of the measurement.

According to embodiments of the present disclosure, as an alternative to the barrier device, a switching device may also be provided. The switching device may temporarily separate the charge carrier source from the control input of the switching element, i.e. at least during the measurement. At the same time, the switching device can couple the measuring device to the control input if it is not permanently connected to the switching input. Thus, the switching device may also serve as a type of toggle switch between the charge carrier source and the measuring device.

According to embodiments of the present disclosure, the monitoring device may comprise a barrier device in the form of a diode arranged between the charge carrier source and the control input in the direction of passage. As diodes are generally simple components, the barrier device may be more simplified. The diode may block the backflow of charge carriers from the control input to the charge carrier source automatically or passively (i.e. without a corresponding control signal). If the charge carrier source is embodied as a voltage source, then the voltage drop across the diode can additionally be taken into account in the voltage source design. Thus, for example, the output voltage should be increased by this voltage drop. Of course, actively controlled barrier devices may also be used.

In one embodiment, the measuring device can be configured to detect the control voltage between the control input and the power output and to determine the time required by the control voltage to drop from the upper threshold value to the lower threshold value. The measuring device can also be configured to take into account the absolute value of the charge carrier drain, i.e. the leakage current, based on the defined time. For example, the measuring device may have comparators, such as window comparators that issue a corresponding comparator signal when the control voltage lies between the upper and the lower threshold values. A time-detecting procedure, for example, can be initiated when the comparator signal is applied and the charge carrier source is off at the same time.

According to embodiments of the present disclosure, the leakage current of the switching element can be calculated on the basis of known threshold values and the time needed by the control voltage to drop from the upper threshold value to the lower threshold value. The following formula may be used for this calculation:

$$I(\text{leakage}) = C(\text{gate}) * [U(\text{upper}) - U(\text{lower})]/t$$

where I(leakage) represents the leakage current to be found and C(gate) represents the capacitance of the control terminal. This value is generally provided by the manufacturer of the switching element. U(upper) represents the upper threshold value and U(lower) the lower threshold. Finally, t represents the measured time.

According to embodiments of the present disclosure, as soon as the control voltage sinks below the lower threshold value, the comparator discontinues the comparator signal or emits a corresponding other signal. This information can be used to switch on the charge carrier source again, thereby charging the control input with charge carriers. For example, with the aid of a window comparator it is very easy to switch on the charge carrier source and generate the comparator signal for the time detection using only one component.

Those skilled in the art would understand from this disclosure that individual elements of the measuring device and of the charge carrier source may be implemented in digital logic elements such as a controller. For example, the time can be determined and the charge carrier source switched on/off in a controller or by a program executed on a controller.

According to embodiments of the present disclosure, the measuring device is adapted to detect the control voltage at the beginning and at the end of a measuring period, which has a specified duration. The measuring device can also be configured to calculate the absolute value of the charge carrier drain, i.e. of the leakage current, on the basis of the difference between the control voltages detected at the beginning and at the end of the measuring period and the specified duration. In this embodiment, the voltage drop may be measured for a predetermined period of time rather than the time required by the control voltage to drop from the upper to the lower threshold value. The above-disclosed equation may be used to calculate the leakage current, such that the measured voltage values are used instead of the values U(upper) and U(lower).

According to embodiments of the present disclosure, the monitoring device may comprise a controllable switch-off device configured to electrically couple the control input to the power output. The switch-off device may be embodied as a transistor, for example, arranged between the control input and the power output of the switching element. If the transistor is interconnected, the control voltage may sink to 0 V. The MOSFET is thereby opened and/or is not conductive.

According to embodiments of the present disclosure, a rapid charge carrier drain from the control input can be prevented, since either a current source with a high internal resistance or a barrier device may be arranged between the charge carrier source and the control input. Thus, the switching element may not be easily switched off in a specific way without the switch-off device.

The described properties of the present disclosure and the manner in which these are achieved will be described in more detail based on the following detailed description. The foregoing general description and the following detailed description are exemplary and explanatory only, and are not restrictive of embodiments consistent with the present disclosure. Further, the accompanying drawings illustrate embodiments of the present disclosure, and together with the description, serve to explain principles of the present disclosure.

BRIEF DESCRIPTION OF THE DRAWINGS

The drawings depict merely schematic representations and serve only to illustrate the present disclosure. The same or similar elements are provided throughout with the same reference numbers. In the drawings.

DETAILED DESCRIPTION

Figure 1:
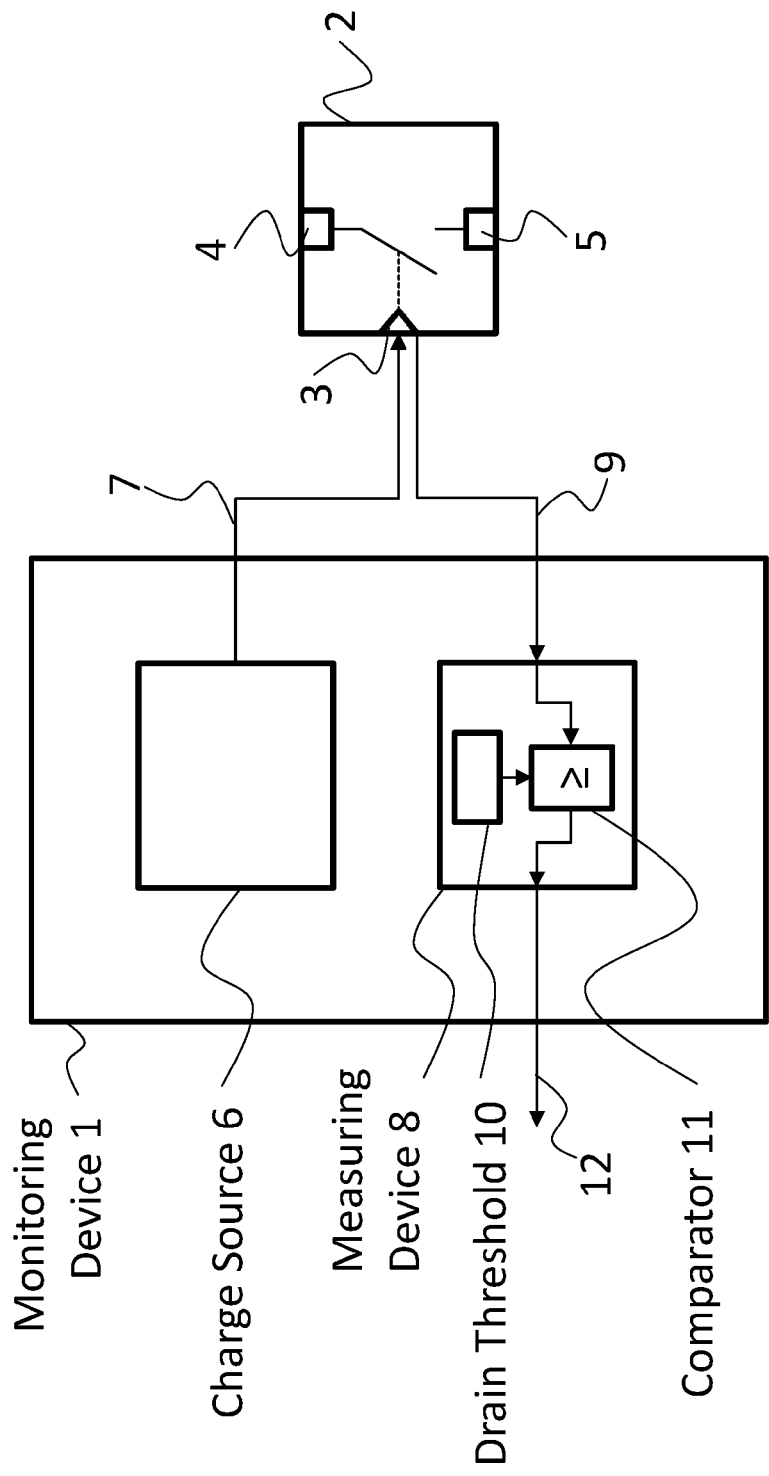
FIG. 1 is a block diagram of an exemplary monitoring device according to an embodiment of the present disclosure.

FIG. 1 shows a block diagram of an embodiment of a monitoring device 1. The monitoring device 1 serves to monitor the switching element 2, such as a MOSFET. The MOSFET 2 has a control input 3, also referred to as a gate, through which an electrical connection can be established between the power input 4, also referred to as a drain, and the power output 5, also referred to as a source, of the MOSFET 2. The MOSFET 2 is then interconnected.

The MOSFET 2 interconnects, i.e., closes, when the voltage at its control input 3 is greater by a predetermined value than the voltage at its power output 5. The voltage difference between the control input 3 and the power output 5 is also known as the control voltage.

To reach the corresponding value for the control voltage, charge carriers 7 may be brought into the control input 3 from a charge carrier source 6. The charge carrier source 6 may be embodied as a (constant) current source or as a (constant) voltage source.

The MOSFET 2 is monitored on the basis of measuring and evaluating the charge carrier drain 9 from the control input 3, i.e. the electric current from the control input 3 or the leakage current. A measuring device 8 therefore monitors the charge carrier drain 9 from the control terminal 3 and compares it in the comparator 11 to a specified drain threshold value 10. The measuring device 8 emits a warning signal 12 if the absolute value of the charge carrier drain 9 is higher than this drain threshold value 10. The warning signal 12 may be evaluated by a higher-level control unit (not shown). If the higher-level control unit recognizes a defect in the switching element 2 as a result of the warning signal 12, the control unit can switch off the switching element 2 or reduce the electric power via its load path, for instance. It is to be understood that the warning signal 12 is not solely provided as a binary signal (no defect/defect). For example, the warning signal may also be an analog-to-digital signal that transmits the absolute value of the leakage current to the higher-level control unit.

Possible examples of drain threshold values 10 generally lie between 15 pA and 20 pA. Of course, other values are possible. The exact drain threshold value 10 here is dependent on the characteristics of the particular switching element 2.

Figure 2:
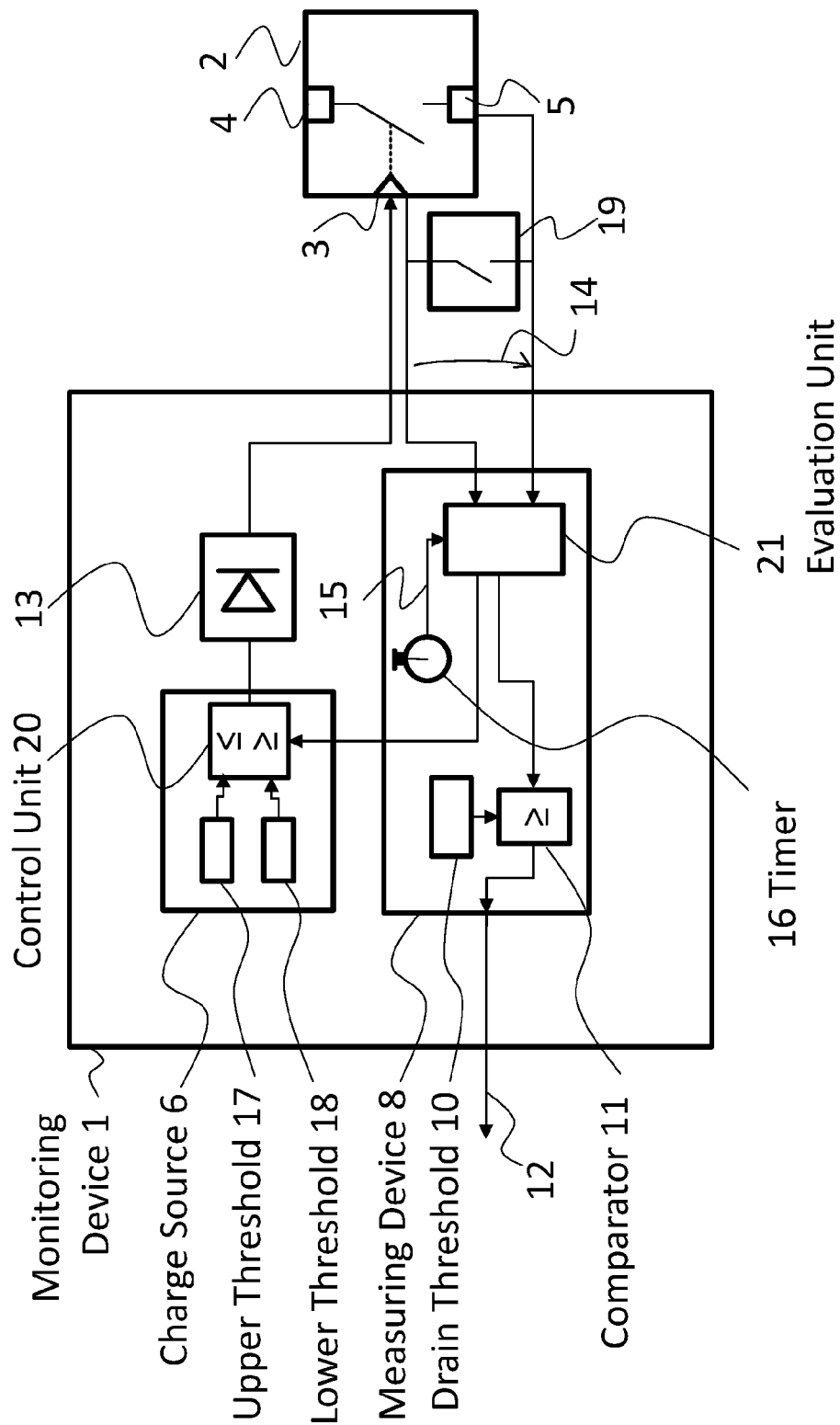
FIG. 2 is a block diagram of an exemplary monitoring device according to another embodiment of the present disclosure.

FIG. 2 shows an expanded version of the monitoring device 1 of FIG. 1. As shown in FIG. 2, the charge carrier source 6 has a control unit 20 that cyclically charges the control voltage 14 up to an upper threshold value 17 and waits between the charging phases until the control voltage 14 has dropped to a lower threshold value 18. In addition, a barrier device 13 is arranged between the charge carrier source 6 and the control input 3. The barrier device 13 prevents a charge carrier backflow from the control input 3 into the charge carrier source 6.

The measuring device 8 has an evaluation unit 21 that detects a voltage at the control input 3 and a voltage at the power output 5 and calculates the control voltage 14 from them. For example, the evaluation unit 21 subtracts the value of the voltage at the power output 5 from the value of the voltage at the control input 3. This value is made available by the evaluation unit 21 to the control unit 20. In some implementations, the control unit 20 can also implement its own voltage detection or gather the value of the control voltage 14 from another information source.

The measuring device 8 also has a timer 16 to record, for the evaluation unit 21, the time 15 needed by the control voltage 14 to drop from the upper threshold value 17 to the lower threshold value 18. Of course, different upper and lower threshold values may be given for the charge carrier source 6 and the evaluation unit 21. In such a case the lower threshold value of the evaluation unit 21 may be greater than the lower threshold value 18. The upper threshold value of the evaluation unit 21 may also be smaller than the upper threshold value 17.

The evaluation unit 21 can calculate the absolute value of the leakage current as follows:

$$I(\text{leakage}) = C(\text{gate}) * [U(\text{upper}) - U(\text{lower})]/t$$

where I(leakage) represents the leakage current to be found and C(gate) is the capacitance of the control terminal. U(upper) represents the upper threshold value and U(lower) the lower threshold value. Finally, t represents the measured time.

Here, merely as an example, the leakage current I(leakage) is calculated for a gate of 16 nF, with U(above) of 14 V, U(below) of 10 V and a t of 5 ms:

$$I(\text{leakage}) = 16 \text{ nF} * [14 \text{ V} - 10 \text{ V}]/5 \text{ ms} = 12.8 \text{ μA}$$

As explained above, generally the threshold values lie between 15 μA-20 μA. Therefore, the calculated leakage current in the above example may indicate an intact MOSFET 2.

Alternatively, the evaluation unit 21 can also detect the drop in the control voltage 14 over a predetermined time period instead of measuring the time for the drop from the upper threshold value 17 to the lower threshold value 18.

Figure 3:
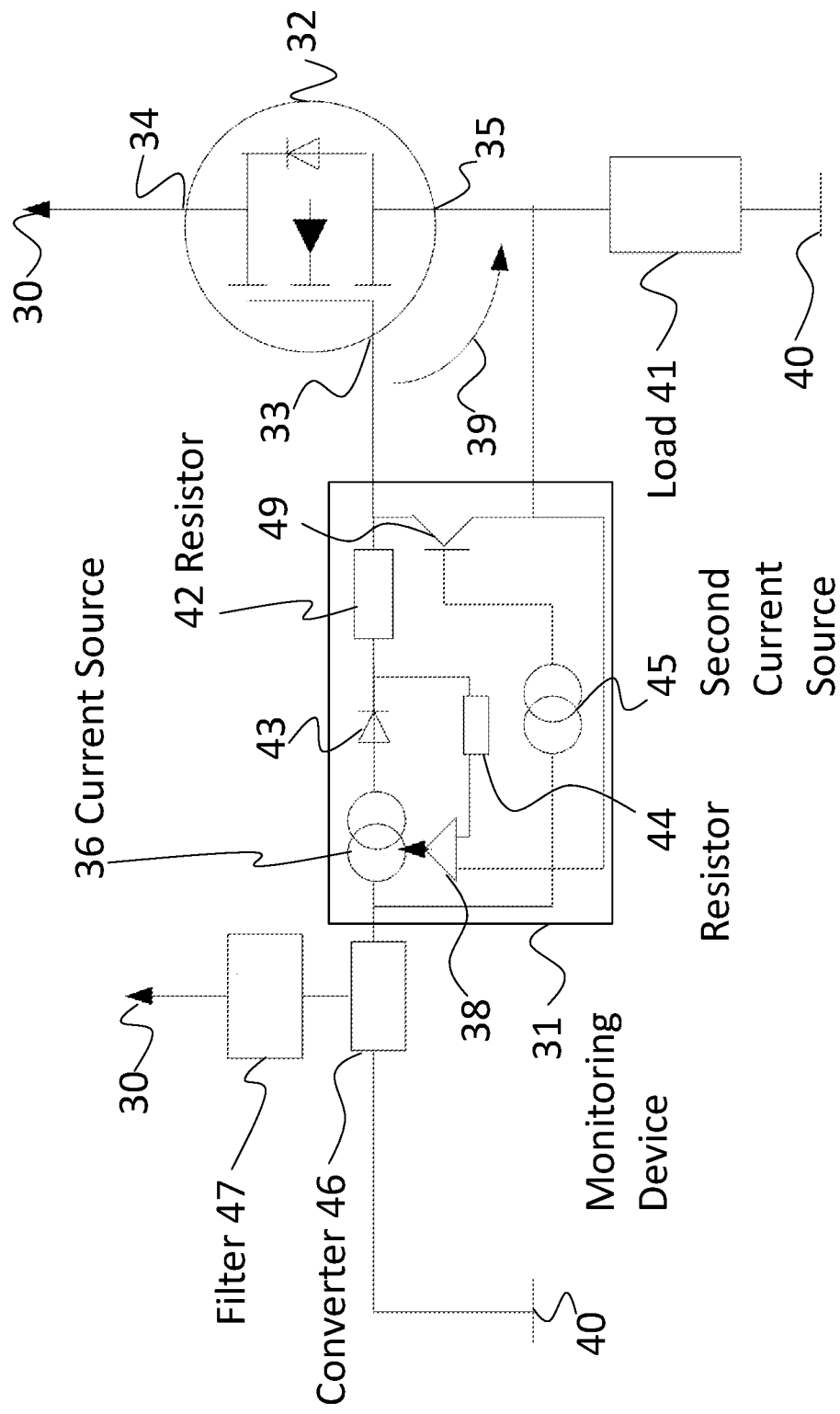
FIG. 3 shows a circuit diagram of an exemplary monitoring device according to yet another embodiment of the present disclosure.

FIG. 3 shows a circuit diagram of a monitoring device 31. The monitoring device 31 is supplied with power via the supply voltage 30 of an on-board electrical system of a vehicle (not shown). A step-up converter 46 serves to increase the supply voltage 30 relative to the vehicle mass 40, such that the control voltage of 14 V can be reached. An EMC filter 47 is arranged between the step-up converter 46 and the supply voltage 30 to filter out disturbances in the supply voltage 30 and to prevent the step-up converter 46 from feeding disturbances into the on-board electrical system of a vehicle.

The drain terminal 34 or power input 34 of a MOSFET 32 is coupled to the supply voltage 30. The source terminal 35 or power output 35 of the MOSFET 32 is coupled at its input side to a load 41 that is coupled in turn to the vehicle mass 40. If the MOSFET 32 interconnects, the voltage on its source terminal 35 increases approximately up to the supply voltage 30, i.e. to approximately 12 V, as the internal resistance of the MOSFET 32 is negligible. The step-up converter 46 may now provide a voltage of 12 V in addition to the desired control voltage 39. For example: 12 V+14 V=26 V.

A current source 36 is arranged in the monitoring device 31. The current source 36 is coupled to the gate terminal 33 of the MOSFET 32 across a barrier device 43, such as a diode, in the direction of passage and a resistor 42. The current source 36 is controlled by a window comparator 38. The window comparator 38 is coupled to the source terminal 35 and via the resistors 44, 42 to the gate terminal 33. This enables detection of the control voltage 39. The upper threshold value and the lower threshold value are set as the boundary values in the window comparator 38. Thus, the window comparator 38 switches the current source 36 on when the control voltage 39 drops below the lower threshold value and switches the current source off when the control voltage 39 rises above the upper threshold value. A charge carrier backflow through the diode 43 to the current source 36 is prevented when the diode is disabled. If the internal resistance of the current source 36 is high enough, the diode 43 may be omitted.

In one implementation, the components described above cyclically charge the gate of the MOSFET 32 up to the upper threshold value for the control voltage 39.

The measuring device can be integrated into a controller, for example, that detects the control voltage 39 via analog-to-digital converters and, based on the signal of the window comparator 38, identifies the time period for measuring the voltage drop. For example, the controller can begin with the voltage measurement when the window comparator 38 switches off the current source. A fixed time frame may be specified. As an alternative it is also possible to specify a voltage difference. The controller then records the time in which the control voltage 39 drops from its initial value by the specified voltage difference. Of course the measuring device may also be built up discretely from analog and/or digital components or integrated into an application-specific integrated circuit (ASIC) or the like.

The monitoring device 31 also has a switch-off device, such as transistor 49, arranged between the gate terminal 33 and the source terminal 35. When this transistor 49 is triggered by a second current source 45, it connects the gate terminal 33 to the source terminal 35, thereby switching off the MOSFET 32. The second current source 45 can be controlled, for example, by the above-disclosed controller or a higher-level control unit, if the load 41 is to be switched off.

Figure 4:
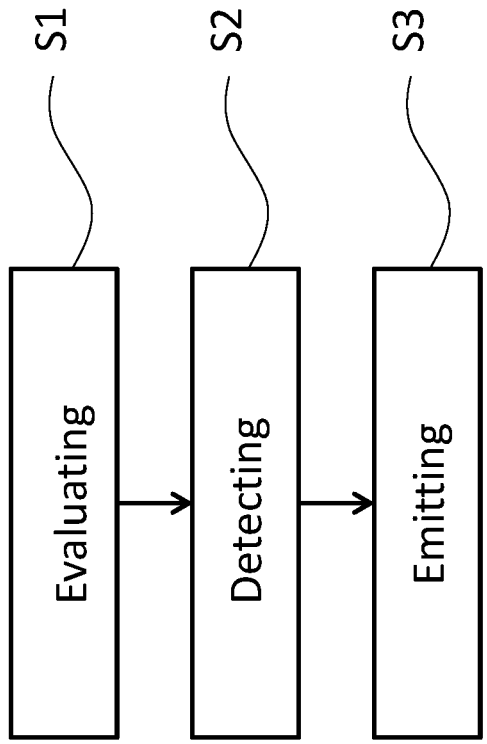
FIG. 4 shows a flowchart of an exemplary method according to an embodiment of the present disclosure.

FIG. 4 is a flowchart of an exemplary method for monitoring a semiconductor-based switching element 2, 32 comprising a control input 3, 33, a power input 4, 34 and a power output 5, 35. To facilitate understanding the reference numbers relating to FIGS. 1-3 will be kept as references in the following description.

In a first step S1 of charging, the control input 3, 33 of the switching element 2, 32 is charged with electric charge carriers 7. A charge carrier source 6, 36 may be used to supply electric charge carriers 7. In a second step S2 of detecting, a charge carrier drain 9 from the control input 3, 33 of the switching element 2, 32 is detected. A warning signal 12 is then emitted in a third step S3, if the charge carrier drain 9 lies above a predetermined drain threshold value 10.

The charge carrier source 6, 36, for example, can provide a constant voltage or a constant current. With this voltage or current the control input 3, 33 is capable of being cyclically charged up to a specified upper threshold value 17 for an electric control voltage 14, 39 at the control input 3, 33. The charge carrier feed can be interrupted after every charging procedure until the control voltage 14, 39 of the control input 3, 33 reaches a lower threshold value 18. In this way the charge carrier drain 9 can be detected in the interruption phases.

To avoid distorting the measurement, a movement of the charge carriers from the control input 3, 33 to the charge carrier source 6, 36 can be prevented if the charge carrier source 6, 36 is inactive. Conversely, the movement of the charge carriers from the charge carrier source 6, 36 to the control input 3, 33 can be allowed if the charge carrier source 6, 36 is active.

In the detection step S2, the control voltage 14, 39 between the control input 3, 33 and the power output 5, 35 can be detected. In addition, the time 15 may be determined that is needed by the control voltage 14, 39 to drop from the upper threshold value 17 to the lower threshold value 18. The absolute value of the charge carrier drain 9 can then be calculated on the basis of the detected time 15.

Alternatively, in the detection step S2, the control voltage 14, 39 can be detected at the beginning and at the end of a measuring period. The measuring period in this instance may be a specified duration. The absolute value of the charge carrier drain 9 is then calculated on the basis of the difference between the detected control voltages 14, 39 at the beginning and at the end of the measuring period and the specified duration.

In some implementations, the control input 3, 33 of the switching element 2, 32 can be electrically coupled to the power output 5, 35 in order to switch off the switching element 2, 32.

Having described aspects of the present disclosure in detail, it will be apparent that modifications and variations are possible without departing from the scope of aspects of the present disclosure as defined in the appended claims. As various changes could be made in the above constructions, products, and methods without departing from the scope of aspects of the present disclosure, it is intended that all matter contained in the above description and shown in the accompanying drawings shall be interpreted as illustrative and not in a limiting sense.

LIST OF REFERENCE NUMBERS

1, 31 monitoring device
2, 32 switching element
3, 33 control input/gate terminal
4, 34 power input, drain, drain terminal
5, 35 power output, source, source terminal
6, 36 charge carrier source/current source/voltage source
7 charge carrier
8 measuring device
9 charge carrier drain
10 drain threshold value
11 comparator
12 warning signal
13, 43 barrier device
14, 39 control voltage
15 time
16 timer
17 upper threshold value
18 lower threshold value
19, 49 switch-off device
20 control unit
21 evaluation unit
30 supply voltage
38 comparator, window comparator
40 mass
41 load
42, 44 resistor
45 second current source
46 step-up converter
47 EMC filter
S1 evaluating step
S2 detecting step
S3 emitting step

What is claimed is:

1. A monitoring device for monitoring a switching element having a control input with a control voltage, the monitoring device comprising:
   a charge carrier source which feeds the control input with electric charge carriers, the charge carrier source being configured to:
      charge the control input until the control voltage reaches an upper threshold value; and
      interrupt the feed of charge carriers until the control voltage reaches a lower threshold value; and
   a measuring device which detects a charge carrier drain from the control input, the measuring device being configured to:
      determine whether the detected charge carrier drain exceeds a carrier drain threshold value; and
      emit a warning signal when the detected charge carrier drain exceeds the carrier drain threshold value.

2. The monitoring device according to claim 1, wherein the charge carrier source comprises at least one of a voltage source or a current source.

3. The monitoring device according to claim 1, wherein the switching element is a semiconductor-based switching element.

4. The monitoring device according to claim 1, wherein the measuring device is configured to detect the charge carrier drain when the feed of charge carriers is interrupted.

5. The monitoring device according to claim 1, comprising:
   a barrier device arranged between the charge carrier source and the control input, the barrier device being configured to:
      prevent a flow of charge carriers from the control input to the charge carrier source when the charge carrier source is inactive; and
      allow the flow of charge carriers from the charge carrier source to the control input when the charge carrier source is active.

6. The monitoring device according to claim 5, wherein the barrier device comprises a diode arranged in the direction of passage between the charge carrier source and the control input.

7. The monitoring device according to claim 1, wherein the measuring device comprises:
an evaluation unit for detecting the control voltage between the control input and a power output of the switching element; and
a timer for measuring the time for the control voltage to drop from the upper threshold value to the lower threshold value;
the evaluation unit being configured to calculate an absolute value of the charge carrier drain based on the measured time.

8. The monitoring device according to claim 7, wherein the evaluation unit calculates the absolute value of the charge carrier drain based on the measured time and a capacitance of the control input.

9. The monitoring device according to claim 1, wherein the measuring device comprises:
an evaluation unit for detecting a first control voltage at the beginning of a measuring period and a second control voltage at the end of the measuring period, the evaluation unit being configured to calculate an absolute value of the charge carrier drain based on a difference between the first and second control voltages and the duration of the measuring period.

10. The monitoring device according to claim 1, comprising:
a controllable switch-off device configured to electrically couple the control input to a power output of the switching element.

11. The monitoring device according to claim 10, wherein the switch-off device is configured to switch off the switching element when triggered by a controlled current source.

12. The monitoring device according to claim 10, wherein the switch-off device comprises a transistor.

13. A method of monitoring a switching element, the switching element comprising a control input having a control voltage, the method comprising:
charging the control input with electric charge carriers from a charge carrier source until the control voltage reaches an upper threshold value;
interrupting the feed of charge carriers until the control voltage reaches a lower threshold value;
detecting a charge carrier drain from the control input;
determining whether the detected charge carrier drain exceeds a carrier drain threshold value; and
emitting a warning signal when the detected charge carrier drain exceeds the carrier drain threshold value.

14. The method according to claim 13, wherein the charge carrier source comprises at least one of a constant voltage or a constant current.

15. The method according to claim 13, wherein the switching element is a semiconductor-based switching element.

16. The method according to claim 13, comprising:
preventing a flow of electric charge carriers from the control input to the charge carrier source when the charge carrier source is inactive; and
allowing the flow of electric charge carriers from the charge carrier source to the control input when the charge carrier source is active.

17. The method according to claim 13, wherein detecting the charge carrier drain comprises:
detecting the control voltage between the control input and a power output of the switching element;
measuring the time for the control voltage to drop from the upper threshold value to the lower threshold value; and
calculating an absolute value of the charge carrier drain based on the measured time.

18. The method according to claim 13, wherein detecting the charge carrier drain comprises:
detecting a first control voltage at the beginning of a measuring period;
detecting a second control voltage at the end of the measuring period; and
calculating an absolute value of the charge carrier drain based on a difference between the first and second control voltages and the duration of the measuring period.

19. The method according to claim 13, comprising:
switching off the switching element by electrically coupling the control input to a power output of the switching element.

* * * * *